(12) United States Patent
Gates et al.

(10) Patent No.: US 7,863,749 B2
(45) Date of Patent: Jan. 4, 2011

(54) ELECTRONIC STRUCTURES UTILIZING ETCH RESISTANT BORON AND PHOSPHORUS MATERIALS AND METHODS TO FORM SAME

(75) Inventors: Stephen M. Gates, Ossining, NY (US); Robert D. Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 52 days.

(21) Appl. No.: 12/180,010

(22) Filed: Jul. 25, 2008

(65) Prior Publication Data

US 2008/0277796 A1 Nov. 13, 2008

Related U.S. Application Data

(63) Continuation of application No. 11/472,726, filed on Jun. 22, 2006, now abandoned.

(51) Int. Cl.
| | |
|---|---|
| H01L 23/48 | (2006.01) |
| H01L 23/52 | (2006.01) |
| H01L 29/40 | (2006.01) |
| H01L 23/58 | (2006.01) |

(52) U.S. Cl. .................. 257/759; 257/632; 257/774; 257/758

(58) Field of Classification Search ................ 257/759, 257/632, 774, 775, 756, 758
See application file for complete search history.

(56) References Cited

U.S. PATENT DOCUMENTS

| | | | |
|---|---|---|---|
| 6,147,009 | A | 11/2000 | Grill et al. |
| 6,309,982 | B1 * | 10/2001 | Chooi et al. ............... 438/758 |
| 6,312,793 | B1 | 11/2001 | Grill et al. |
| 6,479,110 | B2 * | 11/2002 | Grill et al. ................. 427/577 |
| 6,924,240 | B2 * | 8/2005 | Nobutoki et al. ........... 438/783 |
| 2003/0089922 | A1 | 5/2003 | Fujinaga et al. |
| 2003/0222349 | A1 | 12/2003 | Tomohisa et al. |
| 2004/0039219 | A1 | 2/2004 | Chen et al. |

(Continued)

FOREIGN PATENT DOCUMENTS

JP 200319400 11/2000

(Continued)

OTHER PUBLICATIONS

Hacker et al., "Properties of New Low Dielectric Constant Spin-on Silicon Oxide Bases Polymers", Mat. Res. Soc. Symp. Proc., 1997, 25-30, vol. 476.

(Continued)

*Primary Examiner*—Chuong A. Luu
(74) *Attorney, Agent, or Firm*—Scully, Scott, Murphy & Presser, P.C.; Louis J. Percello, Esq.

(57) ABSTRACT

A dense boron-based or phosphorus-based dielectric material is provided. Specifically, the present invention provides a dense boron-based dielectric material comprised of boron and at least one of carbon, nitrogen, and hydrogen or a dense phosphorus-based dielectric comprised of phosphorus and nitrogen. The present invention also provides electronic structures containing the dense boron-based or phosphorus-based dielectric as an etch stop, a dielectric Cu capping material, a CMP stop layer, and/or a reactive ion etching mask in a ULSI back-end-of-the-line (BEOL) interconnect structure. A method of forming the inventive boron-based or phosphorus-based dielectric as well as the electronic structure containing the same are also described in the present invention.

16 Claims, 6 Drawing Sheets

U.S. PATENT DOCUMENTS

2004/0130031 A1    7/2004   Chen et al.
2005/0012201 A1    1/2005   Duerksen et al.
2005/0238889 A1   10/2005   Iwamoto et al.
2006/0071300 A1*   4/2006   Haverty et al. .............. 257/632

OTHER PUBLICATIONS

Malone, L. J., "Basic Concepts of Chemistry", 1981, John Wiley & Sons, Inc., pp. 162-180.

* cited by examiner

ELECTRONIC STRUCTURES UTILIZING ETCH RESISTANT BORON AND PHOSPHORUS MATERIALS AND METHODS TO FORM SAME

RELATED APPLICATIONS

This application is a continuation of U.S. patent application Ser. No. 11/472,726, filed on Jun. 22, 2006.

FIELD OF THE INVENTION

The present invention describes dielectric materials comprised of boron or phosphorus in combination with other elements that have high thermal and chemical stability, and methods for fabricating films of these materials and electronic devices containing such films. More particularly, the present invention relates to a dense boron alloy or dense phosphorus alloy dielectric material for use as an etch stop, a cap material, and/or a hard mask/polish stop in an ultra large scale integrated (ULSI) back-end-of-the-line (BEOL) interconnect structure. Electronic structures containing these materials are provided, and methods for fabrication of such films and structures are also described.

BACKGROUND OF THE INVENTION

The continuous shrinking in dimensions of electronic devices utilized in ULSI circuits in recent years has resulted in increasing the resistance of the BEOL metallization as well as increasing the capacitance of the intralayer and interlayer dielectrics (ILDs). This combined effect increases signal delays in ULSI electronic devices. In order to improve the switching performance of future ULSI circuits, low dielectric constant (k) insulators and particularly those with a dielectric constant k that is significantly lower than that of silicon oxide are needed to reduce the capacitance.

In recent years, polymers containing Si, C, O, and H such as methylsiloxane, methylsesquioxanes, and other organic and inorganic polymers have been typically used in applications for ULSI devices. For instance, materials described in a paper "Properties of new low dielectric constant spin-on silicon oxide based dielectrics" by N. Hacker et al., published in Mat. Res. Soc. Symp. Proc., vol. 476 (1997) p 25 appear to satisfy the thermal stability requirement, even though some of these materials propagate cracks easily when reaching thicknesses needed for integration in the interconnect structure when films are prepared by a spin-on technique.

Dielectrics made as both dense or porous forms of Si, C, O, H alloys (SiCOH) are commonly used in the interconnect structures of integrated circuits. U.S. Pat. Nos. 6,147,009, 6,312,793, and 6,479,110, for example, describe SiCOH materials that are made utilizing a plasma enhanced chemical vapor deposition (PECVD) process. The SiCOH materials may also be deposited by spin coating and other PECVD methods known in the art. Typically, but not necessarily always, such SiCOH materials are used as the interlevel or intralayer dielectric (ILD) in which one or more conductive features are embedded in.

When integrating the SiCOH materials, a new dielectric material is needed having a low etch rate in the reactive ion etching process used to etch the SiCOH material. A significant problem encountered in forming these BEOL interconnect structures with smaller and smaller dimensions is the etch selectivity is poor between the ILD layer comprised of Si, C, O, and H and the underlying layer. Routinely the layer under the ILD is a buried etch stop or is a Cu capping layer that consists of Si, N, C and H. The Cu capping layer is also known, in the art, as a dielectric barrier layer or an etch stop. It is noted that these etch stop and Cu capping layers typically contain 10-30% Si, and they are etched in a fluorine-based chemistry that is also used to etch the Si, C, O, H dielectric.

Another problem with prior art BEOL interconnect structures formed in a porous SiCOH dielectric is that a stop layer for chemical mechanical polishing (CMP) is used on top of the porous SiCOH dielectric, but in the prior art the CMP stop layer has a similar or identical composition to the porous SiCOH dielectric. In some integration schemes, it is desired that the CMP stop layer has the following properties (i) a very low etch rate (on the order of about 1-10 Å/sec, and more preferably 1 Å/sec or less) in a fluorine-based etching process, (ii) thermally and chemically stable, (iii) $H_2O$ resistant so that the water-based CMP slurry does not attack the material by stress-corrosion cracking, and (iv) a low removal rate in the CMP process used to remove metal during damascene integration of SiCOH and porous SiCOH dielectrics. By "thermally and chemically stable" it is meant that the dielectrics do not degrade or undergo any compositional change when processed at a temperature of about 400° C. By "low removal rate" it is meant that the rate of CMP removal is less than 100 nm/minute, and preferably 10-20 nm/minute. The low etch rate and low CMP rate requirements create a need for a thermally and chemically stable material with a chemical composition very different from SiCOH.

In view of the above, there is a need for providing composite alloy materials having a low dielectric constant (k of less than 4.0, preferably less than 3.0) with a high thermal and chemical stability that have a composition other than a SiCOH composition. The non-SiCOH composition should have a low thermal coefficient of expansion (CTE) on the order of about 10-30 ppm/° C. or less and a very low etch rate (on the order of about less than 10 Å/sec) in fluorine-based etching processes. A method of forming such a composite alloy material not including a SiCOH dielectric composition using conventional CVD tools is also needed.

In U.S. Application Publication No 2004/0130031 by Chen et al., methods (by CVD) to make new porous dielectric films using carboranes precursors are described. The carborane molecule or a chemical derivative of carborane is used and incorporated as an intact cage structure into a porous, low density, dielectric material suitable for use in the interconnect structures of integrated circuits. A mechanically robust, low dielectric constant film can be formed by chemical vapor deposition using carborane. The carborane cage forms a small pore or void, and may be a component of a film containing Si and O.

SUMMARY OF THE INVENTION

The present invention provides dense composite alloy materials in which the composition is very different from the SiCOH composition widely used as a dielectric in BEOL structures on integrated circuits.

The present invention further provides alloy materials comprised of boron or phosphorus in combination with other elements, wherein the alloy materials have high thermal and chemical stability. That is, the alloy materials of the present application can withstand processing temperatures of about 400° C. or greater and do not undergo any chemical change during processing.

Specifically, and in one embodiment, the present invention provides an amorphous dielectric material comprised of boron and at least one of carbon, nitrogen and hydrogen. Optionally the inventive boron-based dielectric may contain silicon, germanium, phosphorus, and/or fluorine. In some further embodiments, oxygen may also be present in the inventive boron-based dielectric material. The term "amorphous" denotes that the inventive dielectric material lacks a specific crystal structure.

In an alternate embodiment of the present invention, an amorphous dielectric material comprised of phosphorus and nitrogen is provided. Optionally this inventive phosphorus-based dielectric may contain hydrogen, silicon, germanium and/or fluorine.

The present invention also provides electronic structures containing a dense dielectric amorphous material (hereinafter referred to as a boron-based) comprised of boron in combination with at least one of carbon, nitrogen, and hydrogen and optionally silicon, germanium, phosphorus and/or fluorine as an etch stop, a dielectric Cu capping material, a CMP stop layer, or a reactive ion etching mask in a ULSI back-end-of-the-line (BEOL) interconnect structure. Similar electronic structures are also contemplated for the inventive dense phosphorus-based dielectric material which includes P and N, and optionally hydrogen, silicon, germanium and/or fluorine.

In one embodiment of the present invention, a BEOL interconnect structure that is robust and tolerant of the problem commonly encountered in BEOL structure fabrication called the "misaligned via" is provided. By "robust" it is meant that during fabrication of the BEOL interconnect structure of the present invention, a via formed on a second metal level may be slightly misaligned with respect to the first metal level below. In a normal prior art structure, when dilute HF cleaning of the via is done, there is damage to the first metal level including void formation in the SiCOH or porous SiCOH dielectric and resulting reliability failure. During fabrication of the inventive BEOL interconnect structure of this invention, the dilute HF cleaning solution contacts the stable boron-based dielectric, which is not etched. The stable boron-based dielectric protects the SiCOH or porous SiCOH dielectric from the HF and no void is formed. The inventive phosphorus-based dielectric can be used in a like manner as the inventive boron-based dielectric.

The present invention also provides methods for fabricating films of the inventive boron-based or phosphorus-based dielectric materials.

In accordance with the present invention, thin films having a thickness in the range 3 to 500 nm or less of an amorphous dielectric material comprised of boron or phosphorus are provided. As indicated above, the inventive films in one embodiment include boron and at least one of carbon, nitrogen, and hydrogen and optionally containing silicon, germanium, phosphorus and/or fluorine. A preferred form of the inventive boron-based dielectric material has the formula $C_2B_{10}H_z$, where z may be any integer up to 10. In another embodiment, the inventive films include phosphorus and N and optionally hydrogen, silicon, germanium and/or fluorine In accordance with the present invention, electronic structures that include layers of the inventive boron-based or phosphorus-based dielectric are also described. These structures use a layer of the boron-based dielectric or phosphorus-based dielectric as a Cu capping material, a buried etch stop, a CMP stop layer, and/or a reactive ion etching mask. The structures are ULSI back-end-of-the-line (BEOL) interconnect structures. Embodiments are described in which a dense boron-based dielectric or phosphorus-based dielectric is used in each of the applications mentioned above, i.e., as a Cu capping material, a buried etch stop, a CMP stop layer, and/or a reactive ion etching mask.

In general terms, the inventive electronic structure comprises:
a preprocessed semiconducting substrate;
an interlayer or intralayer dielectric (ILD) located atop substrate, said ILD including at least one conductive feature embedded therein; and
a dense dielectric comprising either (i) boron and at least one of carbon, nitrogen and hydrogen or (ii) phosphorus and nitrogen, wherein said dense dielectric and said ILD are in intimate contact and top surfaces of said ILD and said at least one conductive feature are essentially coplanar.

The invention further provides methods for fabricating these dense films using new precursors in PECVD and remote plasma CVD reactors.

In general terms, the method of the present invention comprises:
positioning a substrate in a chemical vapor deposition reactor;
flowing a first precursor gas including either (i) boron in combination with at least one of C, N, and H, or (ii) phosphorus in combination with N into said CVD reactor;
providing energy to at least said first precursor gas; and
depositing a dense dielectric film either comprising (i) boron in combination with at least one of C, N, and H or (ii) phosphorus and N on said substrate.

BRIEF DESCRIPTION OF THE DRAWINGS

These and other objects, features and advantages of the present invention will become apparent from the following detailed description and the appended drawings in which.

DETAILED DESCRIPTION OF THE PRESENT INVENTION AND PREFERRED EMBODIMENTS THEREOF

Figure 1A:
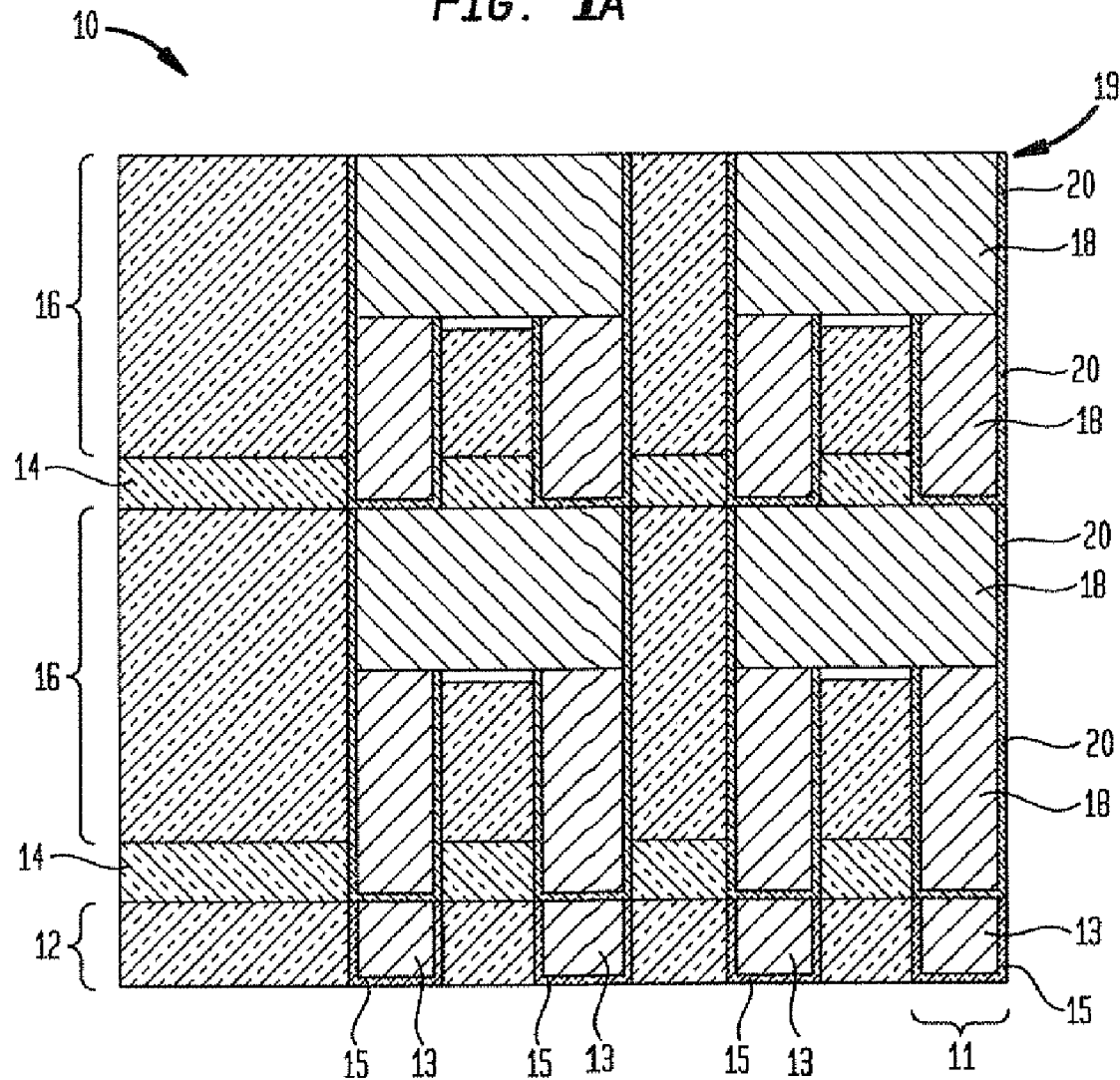
FIG. 1A is a pictorial representation (through a cross sectional view) of a BEOL interconnect structure with a boron-based dielectric layer as the Cu cap/etch stop layer.

The present invention, which describes a boron-based or phosphorus-based dielectric material, a method of fabricating the same, electronic structures including the boron-based or phosphorus-based dielectric and methods of fabricating such electronic structures, will now be described in greater detail by referring to the following discussion and drawings that accompany the present application. It is noted that the drawings of the present application are provided for illustrative proposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

In one embodiment of the present invention, a boron-based dielectric that includes boron and at least one of carbon (C), nitrogen (N), and hydrogen (H) is provided. Optionally the inventive boron-based dielectric may contain silicon (Si), germanium (Ge), phosphorus (P) and/or fluorine (F).

In an alternate embodiment of the present invention, an amorphous dielectric material comprised of phosphorus and nitrogen is provided. Optionally this inventive phosphorus-based dielectric may contain hydrogen, silicon, germanium and/or fluorine.

The electronic devices of the present invention are shown in FIGS. 1A-1C and 2-3. It should be noted that the devices shown in the drawings are merely illustrative examples of the present invention while an infinite number of other devices may also be formed using the materials and methods of this invention. Common to each of the illustrated devices is that they contain a layer of the inventive boron-based dielectric. Although the inventive boron-based dielectric is specifically mentioned to be present in these devices, the inventive boron-based dielectric in each device may be replaced by the inventive phosphorus-based dielectric.

In accordance with the present invention, the inventive boron-based dielectric includes from about 5 to about 90, preferably from about 10 to about 75, and even more preferably from about 10 to about 50, atomic percent boron. When C is present in the inventive boron-based dielectric, it is present in an amount from about 5 to about 50, more preferably from about 10 to about 40, and even more preferably from about 25 to about 30, atomic percent. When N is present in the inventive boron-based dielectric, it is present in an amount from 5 and about 50, more preferably from about 10 to about 40, and even more preferably from about 15 to about 35, atomic percent. When H is present in the inventive boron-based dielectric, it is present in an amount from about 20 to about 60, more preferably from about 25 to about 50, and even more preferably from about 30 to about 45, atomic percent.

The inventive boron-based dielectric may also contain at least one of silicon (Si), germanium (Ge), phosphorus (P) and fluorine (F). When Si is present in the inventive boron-based dielectric, it is present in an amount from about 1 to about 20, more preferably from about 2 to about 15, and even more preferably from about 3 to about 10, atomic percent. When Ge is present in the inventive boron-based dielectric, it is present in an amount from about 1 to about 20, more preferably from about 2 to about 15, and even more preferably from about 5 to about 15, atomic percent. When F is present in the inventive boron-based dielectric, it is present in an amount from about 3 to about 35, more preferably from about 5 to about 25, and even more preferably from about 5 to about 15, atomic percent. When phosphorus is present in the inventive boron-based dielectric material, it is present in an amount from about 1 to about 50, more preferably from about 5 to about 25, and even more preferably from about 5 to about 10, atomic percent.

In one preferred embodiment of the present invention, a composition of BCH is produced. In another preferred embodiment of the present invention, a composition of $B_{10}C_2H_z$, is provided in which z is in the range 1-10. This composition may also include Si, N, O and/or fluorine. Other preferred compositions include $B_3N_3H_y$, where y is less than 6, $C_3N_3B_3H_k$ wherein k less than 12, $C_6N_3B_3H_l$ wherein l is less than 18. These compositions may further include Si, Ge, P, O and/or fluorine.

A general description of the deposited boron-based dielectric material is a composition having the formula $B_xC_yR_z$, or $B_xN_yR_z$, wherein x, y and z indicate the composition. As is known in the art, x, y and z may have a range of values corresponding to a range of amorphous materials. For example, in a preferred composition x=y, and in a related composition x, y and z can vary. The substituents R may be retained in the deposited film, or not, and can be halogen, hydrogen, alkyl, aryl, alkoxy, amino, substituted amino and other like moieties.

In the case of the generalized formula $B_xC_yR_z$, the boron content can vary from x=0.01 to 0.99, and is preferably 0.05 to 0.9. The carbon content is lower and can vary from y 0.01 to 0.5, and is most preferably from 0.05 to 0.25. The content K, including N, can be from 0.01 to 0.5. The actual atomic percentages will vary.

The inventive boron-based dielectric is a dense (i.e., non-porous) material having a density from about 0.9 to about 2.0, more preferably from about 1.1 to about 1.8, grams/cm$^3$ as determined by x-ray reflectivity, Rutherford backscattering, or microbalance methods. Notwithstanding the application of the inventive boron-based dielectric, the dense dielectric has an as-deposited thickness from about 30 to 5000, preferably from about 50 to about 1000, Å. Moreover, the inventive boron-based dielectric has a dielectric constant (relative to a vacuum) of about 3.5 or less, with a dielectric constant of about 3.0 or less being more preferred.

In the embodiment including phosphorus, phosphorus is present in an amount from about 10 to about 80, preferably from about 20 to about 60, and even more preferably from about 30 to about 50, atomic percent. Nitrogen is present in the inventive phosphorus-based dielectric in an amount from about 10 to about 80, preferably from about 20 to about 60, and even more preferably from about 30 to about 50, atomic percent. The optional components are present in the amounts specified above for the inventive boron-based dielectric.

The dense (i.e., non-porous) phosphorus-based material has a density from about 0.9 to about 2.0, more preferably from about 11.1 to about 1.8, grams/cm$^3$ as determined by x-ray reflectivity, Rutherford backscattering, or microbalance methods. It is deposited onto a substrate in the same thickness ranges as recited above for the boron-based dielectric material.

In FIG. 1A, an electronic device including multiple interconnect levels is shown. Specifically, FIG. 1A shows an interconnect wiring structure 10 that includes a preprocessed semiconductor substrate 12 which may contain further wiring layers and active semiconductor devices. The substrate 12 includes any semiconducting material including, for example, Si, SiGe, SiGeC, SiC, Ge alloys, GaAs, InAs, InP and other III/V or II/VI compound semiconductors. In addition to these listed types of semiconducting materials, the present invention also contemplates cases in which the semiconductor substrate 12 is a layered semiconductor such as, for example, Si/SiGe, Si/SiC, silicon-on-insulators (SOIs) or silicon germanium-on-insulators (SGOIs). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

It is also noted that the semiconductor substrate 12 may be strained, unstrained or contain strained regions and unstrained regions therein. The semiconductor substrate 12 may also have a single crystal orientation or alternatively, the substrate 12 may be a hybrid semiconductor substrate that has surface regions having different crystallographic orientations.

The preprocessed substrate 12 includes a conductive feature 11 therein. The conductive feature 11 includes a conductive material 13 (e.g., polySi, polySiGe, a conductive metal such as, for example, Cu, W or Al, a conductive metal alloy such as AlCu, a conductive metal silicide such as WSi or CuSi or combinations thereof, which is separated in part from the preprocessed substrate 12 by a diffusion barrier 15. The diffusion barrier 15 includes one of Ta, TaN, Ti, TiN, Ru, RuN, W, WN or any other material that can serve as a barrier to prevent conductive material from diffusing therethrough. Typically, the diffusion barrier 15 is comprised of a TaN/Ta bilayer.

Each interconnect level includes a Cu cap/etch stop layer 14 comprised of the inventive boron-based dielectric which is formed on the preprocessed substrate 12 or atop an ILD. An ILD, for example a SiCOH or porous SiCOH dielectric, 16 is disposed atop the Cu cap/etch stop 14 in each interconnect level. The ILD 16 may also include any other dielectric material besides a SiCOH material which has a dielectric constant of about 4.0 or less, with a dielectric constant of about 3.6 or less being more preferred. Other ILD's besides SiCOH which are contemplated in the present invention include, but are not limited to: $SiO_2$, silsesquioxanes, or thermosetting polyarylene ethers. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl or the like.

Figure 1B:
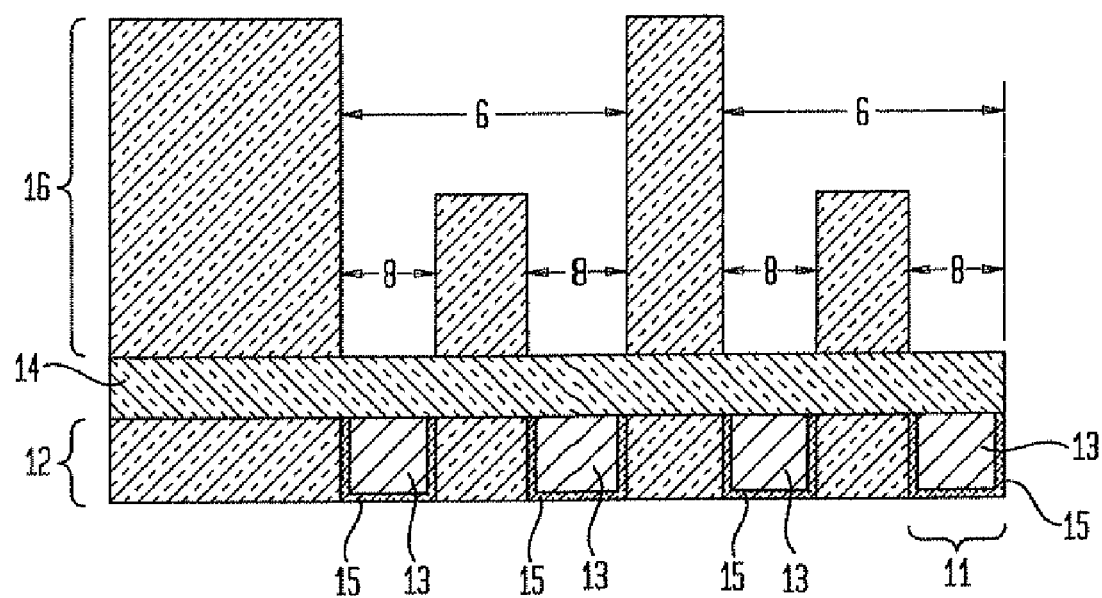
FIG. 1B shows (in cross sectional view) the formation of etched openings, stopping on the inventive boron-based dielectric, during fabrication of the structure of FIG. 1A.
Figure 1C:
FIG. 1C shows (in cross sectional view) an alternate embodiment in which a Cu capping layer is made in two layers, including the boron-based dielectric layer as the upper layer.

The structure shown in FIG. 1A is formed utilizing conventional interconnect techniques well known in the art, including dual damascene processing. When etching dual damascene openings, as shown in FIG. 1B, a fluorine-based etch is used to form the dual damascene openings that "stops" (i.e., has a very low etch rate) on the Cu/cap/etch stop layer 14 that includes the inventive boron-based dielectric layer. In FIG. 1B, the etched trench opening is denoted by reference numeral 6, and the etched via opening is denoted by reference numeral 8. It is noted that the formation of the via opening 8 has stopped on the Cu cap/etch stop layer 14. Other elements illustrated within FIG. 1B are numbered as in FIG. 1A.

Referring again to FIG. 1A, a region of a conductive material 18 is embedded in the ILD 16 in each of the interconnect levels. The conductive material 18 may comprise the same or different conductive material 13 as that present in conductive feature 11. Typically, the conductive material 18 is comprised of a metal such as, for example, Cu, W or Al, with Cu or alloys of Cu such as AlCu being highly preferred. A diffusion liner 20, such as a TaN/Ta bilayer or any of the other materials mentioned above as the diffusion barrier 15 present in the conductive feature 11, separates the conductive material 18 from the ILD 16. The entire structure has been planarized by a chemical mechanical polishing (CMP) process that removes the excess conductive material, and leaves the top surfaces of conductive material 18 and the ILD 16 of the uppermost interconnect level essentially coplanar. The coplanar surface is designed by reference numeral 19 in FIG. 1A.

In one embodiment, as shown in FIG. 1A, the Cu cap/etch stop 14 is a single layer that functions as a diffusion barrier layer for preventing diffusion of the conductive material 18 into the ILD 16 or into the other layers in the interconnect structure. In an alternate embodiment, shown in FIG. 1C, the Cu cap/etch stop 14 is comprised of two layers. The lower layer 26 is atop the conductive material 18 and the ILD dielectric 16, and it is comprised of a Si, C, N, H or Si N, H alloy known in the art to be a preferred Cu cap material providing excellent Cu reliability and preventing diffusion of the conductive material 18 into the dielectric 16. The upper layer 28 of layer 14 serves as an etch stop, and is made from the inventive boron-based dielectric material recited above.

Figure 2A:
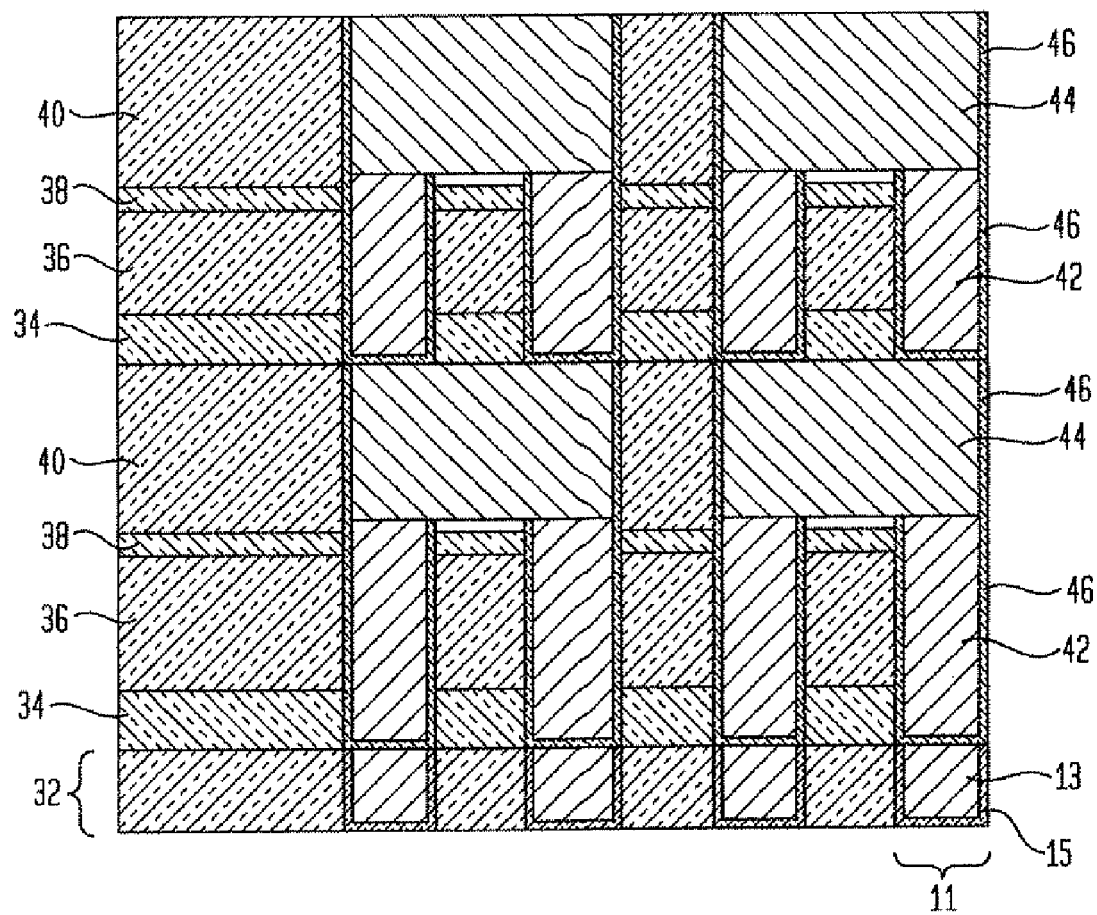
FIGS. 2A-2B are pictorial representations (through cross sectional views) of a BEOL interconnect structure with a boron-based dielectric layer as a buried etch stop.
Figure 2B:
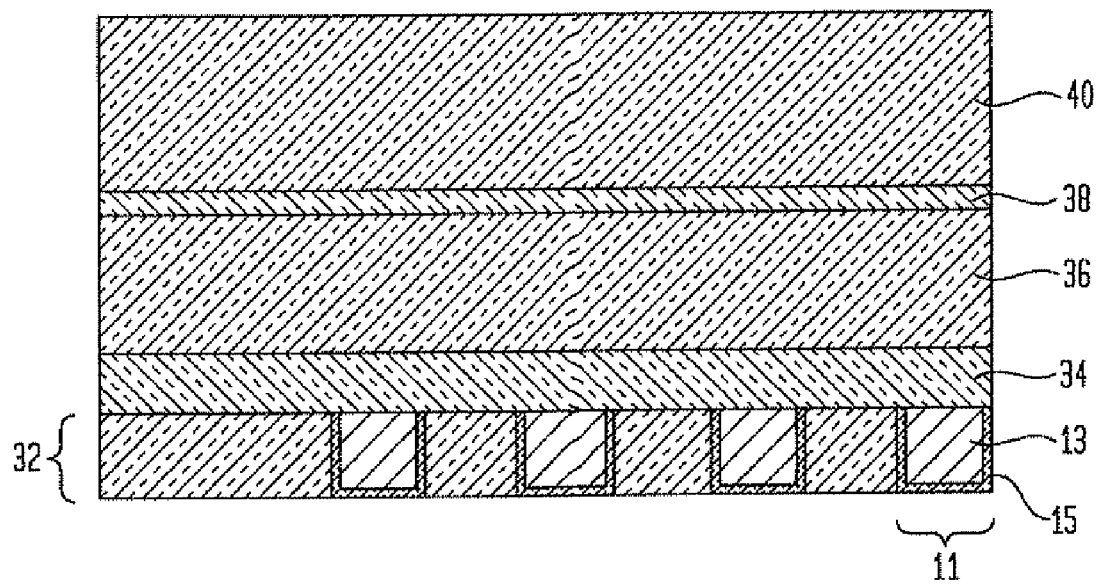

The next embodiment of the present invention is shown in FIGS. 2A-2B. Specifically, FIGS. 2A-2B illustrates a multi-level interconnect structure with the inventive boron-based dielectric material as a buried etch stop. In FIG. 2A, an electronic device 30 built on a substrate 32 is shown. The wiring structure includes a preprocessed semiconducting substrate 32 which may contain further wiring layers and active semiconductor devices. On top of the substrate 32, a dielectric etch stop 34 is formed. The dielectric etch stop 34 may comprise the inventive boron-based dielectric material (preferred) or it may comprise any conventional dielectric material that can serve as an etch stop layer such as, for example, SiN, SiC, SiCN, and these alloys containing hydrogen.

A first ILD, such as, for example, a SiCOH or porous SiCOH dielectric, 36 is deposited atop the dielectric etch stop 34. Atop the first ILD 36 is a buried etch stop layer 38 that is comprised of the inventive boron-based dielectric. This layer is used to form the bottom of the dual damascene trench by providing a low etch rate in the ILD etch (during the trench etch step). Atop the buried etch stop layer 38, a second ILD 40 (consisting of one of the above mentioned dielectrics such as, for example, SiCOH or porous SiCOH) is formed. A second interconnect level including layers 34, 36, 38 and 40 is also shown. Referring to FIG. 2A again, a region of conductive material 42 (the via) is embedded in the first ILD 36, and a second region of conductive material 44 (the line) is embedded in the second ILD 40. The conductive material includes those mentioned above. A diffusion liner, 46, such as a TaN/Ta bilayer, separates each of the conductive regions from the dielectric, and prevents conductive material such as Cu from entering the dielectric. The entire structure has been planarized by a CMP process that removes the excess conductive material, and leaves the top surfaces of conductive material 44 and the ILD 40 essentially coplanar.

In FIG. 2B, the stack of dielectric layers is shown before formation of the wiring structure. On top of the substrate 32, the dielectric etch stop 34 is formed. The first ILD 36 is deposited atop the dielectric etch stop 34. Next, the inventive boron-based dielectric which is used as a buried etch stop layer 38 is formed atop the first ILD 36. Atop the buried etch stop layer 38, the second ILD 40 is formed.

Figure 3A:
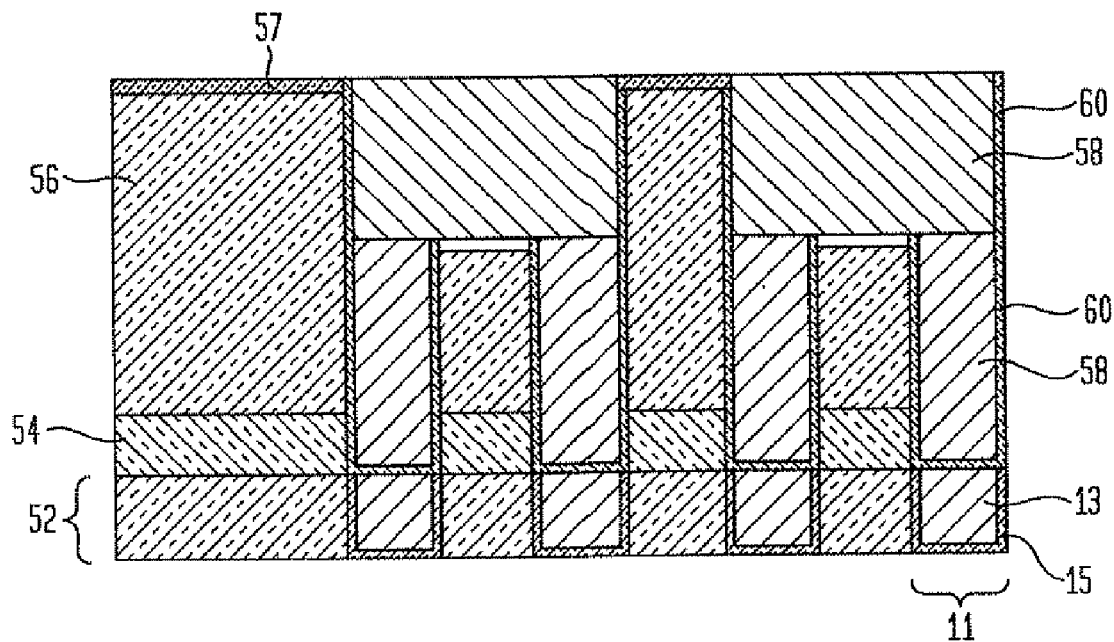
FIGS. 3A-3B are pictorial representations (through cross sectional views) of a BEOL interconnect structure with a boron-based dielectric layer as a CMP stop layer.
Figure 3B:
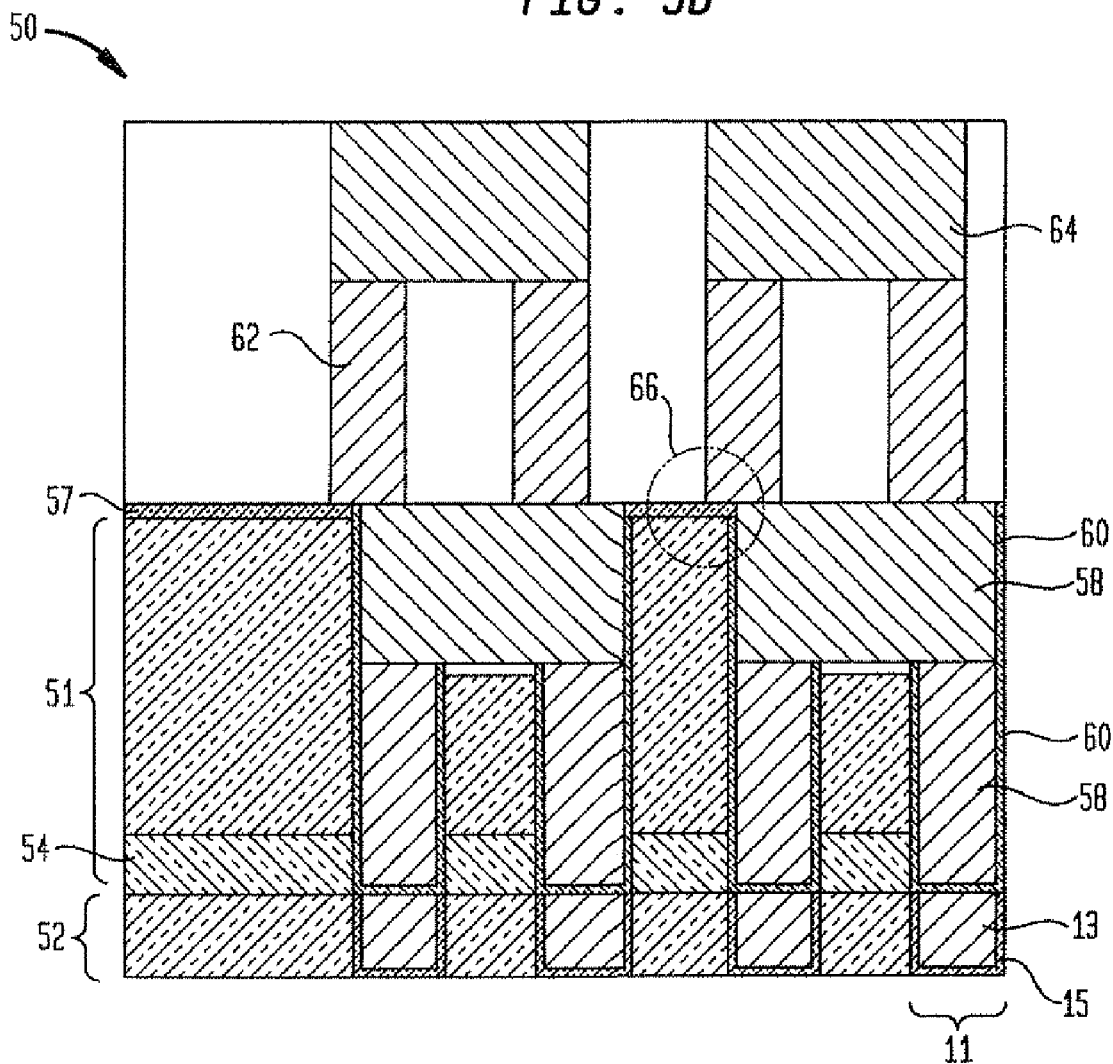

The next embodiment of the present invention is shown in FIGS. 3A-3B. In this embodiment of the present invention, a BEOL interconnect structure is provided that includes the inventive boron-based dielectric as a CMP stop layer. This structure helps to solve a problem commonly encountered in BEOL structure fabrication, called the "misaligned via", as described below.

In FIG. 3A, an electronic device 50 built on a substrate 52 is shown. The wiring structure includes a preprocessed semiconducting substrate 52 which may contain further wiring layers and active semiconductor devices. On top of the substrate 52, a Cu cap/etch stop 54 is formed. The Cu cap/etch stop 54 may comprise the inventive boron-based dielectric material (preferred) or it may comprise any other dielectric material that can serve as a Cu cap/etch stop layer including, for example, SiN, SiC, SiCN, and these alloys containing hydrogen.

An ILD 56 is then deposited atop the Cu cap/etch stop 54. A CMP stop layer 57 which is comprised of the inventive boron-based dielectric is formed atop the ILD 56. It is noted that the CMP etch stop layer 57 remains in the completed BEOL wiring structure. FIG. 3A also illustrates a region of conductive material 58 embedded in the ILD 56. A diffusion liner 60, such as a TaN/Ta, separates the conductive material 58 from the ILD 56. The entire structure has been planarized by a CMP process that removes the excess conductive material, and leaves the top surfaces of conductive material 58 and the CMP stop layer 57 essentially coplanar.

In FIG. 3B, the "misaligned via" condition is shown. Referring to FIG. 3B, a second level of dual damascene interconnects is patterned above a first level, 51, and the via opening 62 and the line opening 64 are shown. When lithographic alignment of the second level is not perfect with respect to the first level 50, the via may be partially 'off' of the line below due to misalignment, the condition shown in the dashed circle 66. As is known in the art, the etch of the via opening commonly etches the dielectric below, forming a void or an unwanted opening next to the line 58. Wet cleaning solution such as HF will further enlarge this opening. Many serious reliability issues result from the formation of voids next to the line. Using the inventive boron-based dielectric as the CMP stop layer 57 results in a more robust and reliable structure because (i) the etch of the via opening "stops" on the inventive CMP stop layer 57 due to a slow etch rate, and (ii) dilute HF and other chemical wet cleaning solutions do not etch the inventive CMP stop layer 57. Openings next to the line below do not form, and the structure shown in FIG. 3A is more robust and reliable than conventional prior art dual damascene structures.

Figure 4:
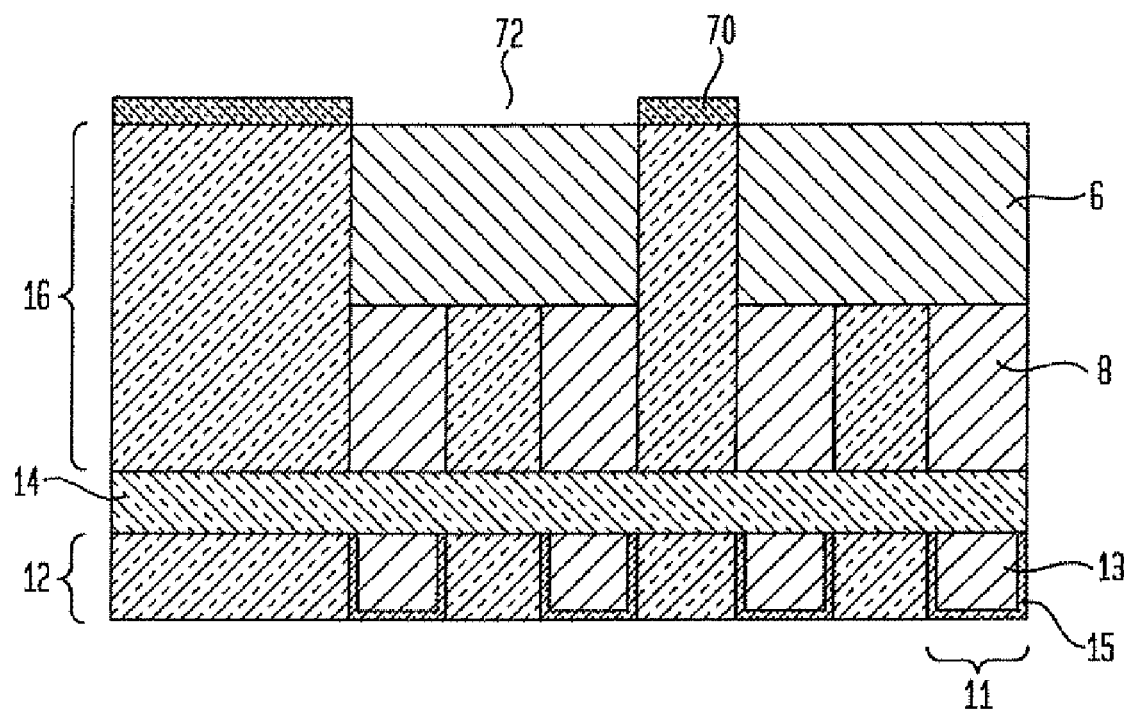
FIG. 4 is a pictorial representation (through a cross sectional view) of a BEOL interconnect structure with a boron-based dielectric layer as a reactive ion etch (RIE) mask patterning layer.

The next embodiment of the present invention is shown in FIG. 4. Specifically, the next embodiment includes a method to pattern a SiCOH or porous SiCOH dielectric (or one of the other ILD materials) using the inventive boron-based dielectric as a RIE mask layer (used for example to form a BEOL interconnect structure). Note that the RIE mask layer is removed from the completed structure. Many items in FIG. 4 are labeled as in FIG. 1B. Layer 70, which is the inventive boron-based dielectric, is located atop the ILD layer 16. Layer 70, consists of mask regions 70 and openings 72.

Referring to FIG. 4, the hard masking layer 70 has been patterned with openings 72. This is done by coating a photoresist on top of layer 66, using a lithography process (as known in the art) to pattern the photoresist, and transferring the pattern in the photoresist to the masking layer 70 using a suitable etch chemistry. The photoresist is then removed to leave the structure of FIG. 4. The layer 70 has been used to etch openings 6 in the ILD 16.

Next, a method to deposit a layer of the inventive boron-based dielectric is described. First a chemical vapor deposition (CVD) reactor is provided and a substrate is positioned in the reactor. Optionally, the substrate is located on a heated wafer chuck having a selected temperature from about 100° to about 450° C., and preferably from about 300° to 400° C. Then, a first precursor gas or liquid including boron in combination with at least one of C, N and H, and optionally, at least one of Si, F, P and Ge, is flowed into the CVD reactor, while optionally flowing at least a second precursor. A diluent gas may also be optionally employed. After stabilizing the pressure in the reactor at a suitable pressure (on the order of about 1-10 Torr or less), energy is provided to the mixture of precursor gases for a desired time, until the film of desired thickness has deposited on the substrate.

It is noted that the inventive phosphorus-based dielectric of the present invention is made in a similar manner as that of the boron-based except that a precursor including phosphorus and nitrogen is used instead of the first precursors described herein below for the boron-based dielectric embodiment.

The flows of the liquid precursors are given here in milligrams/minute, known as mgm. The first precursor flow into the reactor is typically from about 10 to about 2000 mgm, with a flow of first precursor from about 1100 to about 1000 mgm being more highly preferred.

As is known in the art, the energy may be RF energy that is capacitively coupled to at least one electrode inside the reactor, or RF or microwave energy that is applied through a remote plasma source, or may be RF energy that is inductively coupled. Optionally, a bias or a second RF signal may be applied to the substrate in order to accelerate ions from the plasma to collide with the growing film layer during deposition, in order to render the film more dense, and to adjust the internal stress in the film.

A plasma is formed in the reactor and a film comprising boron in combination with at least one of C, N and H, and optionally at least one of Si, F, P and Ge, is deposited on the substrate. The first precursor utilized in the present invention may include at least one of the following molecules: carborane, decaborane, borazine, substituted borazines such as trimethylborazine, hexamethylborazine, or substituted with other alkyl groups, phenyl groups, vinyl groups (divinyl- or trivinyl-borazine, etc.), alkylamino substituted borazines, such as (dimethylamino)borazine, tri(dimethylamino)borazine, and borazines substituted with alkoxy (ethoxy, etc.), fluorine or other halogens.

Alternatively, a derivative of carborane may be used, such as carboranes containing alkoxy, alkyl, vinyl, phenyl or acetylene substituents. Commonly, these substituents are bonded to the C in carborane, but the substituent may be bonded to another site.

Alternatively, a molecule containing BN groups substituted into a fullerene cage may be used.

The precursor can be delivered directly as a gas to the reactor, delivered as a liquid vaporized directly within the reactor, or transported by an inert carrier gas such as helium or argon. In a preferred embodiment, the first precursor is carborane.

The first precursor may be admixed with a second precursor to form a precursor mixture. The second precursor comprises $B_2H_6$ (diborane), and other boron hydride compositions including, but not limited to, $B_{10}H_{10}$ (decaborane).

In one embodiment, the precursor mixture may further contain another hydride molecule such as diborane, a silane (mono- di- trisilane, or the like), ammonia, an alkyl silane such as methylsilane or trimethylsilane, germane, or other hydrides.

In another embodiment, the precursor mixture may further contain a fluoride molecule such as silicon tetrafluoride ($SiF_4$), $NF_3$, and the like.

The following example is provided to illustrate a method of forming the inventive boron-based dielectric. In this example, a plasma was operated in a continuous mode during film deposition. The gas mixture consisted of a mixture of carborane at a flow rate of 500 sccm and He at a flow rate of 500 sccm. The pressure in the reactor was maintained at 5 Torr. The gas was delivered through a gas distribution plate which was also the powered electrode to which a RF power of 500 W was applied at a frequency of 13.56 MHZ. The substrate was a 200 mm Si wafer containing pre-formed semiconductor devices. The substrate was positioned on the heater chuck at a temperature of 350° C., and a power of 50 W was applied to the substrate, also at a frequency of 13.56 MHZ.

As is known in the art, the above specifics serve as example values only, and any plasma condition may be used within the invention.

Within the invention, other gases such as Ar, $H_2$, and $N_2$ can be used as carrier gases. If the precursor has sufficient vapor pressure, no carrier gas may be needed. An alternative way to transport a liquid precursor to the plasma reactor is by use of a liquid delivery system. Nitrogen, boron, carbon, silicon, hydrogen, germanium, or fluorine containing gases can be added to the gas mixture in the reactor if needed to modify the composition and properties of the film.

Next, a different example is provided to illustrates a method of forming the inventive phosphorus-based dielectric. In this example, a plasma was operated in a continuous mode during film deposition. The gas mixture consisted of a mixture of a cyclophosphazenes ($N_3P_3H_m$ where m is 6 or less). In related embodiment, derivatives of the cyclophosphazenes were used, shown as $N_3P_3R_n$ where R can be fluorine, alkyl, aryl alkoxy, silyl and related groups, and n is 6 or less.

The cyclophosphazene flow rate was 500 sccm and He at a flow rate of 500 sccm. The pressure in the reactor was maintained at 5 Torr. The gas was delivered through a gas distribution plate which was also the powered electrode to which a RF power of 500 W was applied at a frequency of 13.56 MHZ. The substrate was a 200 mm Si wafer containing preformed semiconductor devices. The substrate was positioned on the heater chuck at a temperature of 350° C., and a power of 50 W was applied to the substrate, also at a frequency of 13.56 MHZ.

As is known in the art, the above specifics serve as example values only, and any plasma condition may be used within the invention.

Within the invention, other gases such as Ar, $H_2$, and $N_2$ can be used as carrier gases. If the precursor has sufficient vapor pressure, no carrier gas may be needed. An alternative way to transport a liquid precursor to the plasma reactor is by use of a liquid delivery system. Nitrogen, boron, carbon, silicon, hydrogen, germanium, or fluorine containing gases can be added to the gas mixture in the reactor if needed to modify the composition and properties of the film.

The deposited material has a composition of $N_{x'}P_{y'}R_{z'}$, where x', y' and z' indicate the composition. As is known in the art, x', y' and z' may have a range of values corresponding to a range of amorphous materials. For example, in a preferred composition x'=y', and in a related composition x'=3, y'=1-3, and z' can vary from 1 to 6. The substituents R can be halogen, hydrogen, alkyl, aryl, alkoxy, amino, substituted amino and other like moieties. Typically, z'=2y'. In related materials within the invention, one or more of the phosphorus atoms may be substituted with carbon, sulfur or sulfur oxidized species.

In the case of the generalized formula $N_{x'}P_{y'}R_{z'}$, the nitrogen content can vary from x'=0.01 to 0.9, and is preferably from 0.03 to 0.5. The phosphorus content can vary from y'=0.01 to 0.9, and is most preferably from 0.03 to 0.5. In materials with little R substituent retained, z' is low, and both x' and y' can be from 0.3 to 0.5. The phosphorus-based dielectric materials are thermally stable, with a dielectric constant of less than 4, which shows good etch selectivity over organosilicates of the SiCOH composition.

The present invention novel method and the electronic structures formed by such method have therefore been amply described in the above descriptions and in the appended drawings of FIGS. 1-4. It should be emphasized that the examples of the present invention electronic structures shown in FIGS. 1-4 are merely used as illustrations for the present invention novel devices, and the inventive boron-based dielectric can be applied in the fabrication of an infinite number of electronic devices.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions. The embodiment of the invention in which an exclusive property or privilege is claimed are defined as follows:

What is claimed is:

1. An electronic structure having layers of insulating material as intralevel or interlevel dielectrics in a wiring structure comprising:
   a preprocessed semiconducting substrate;
   an interlayer or intralayer dielectric (ILD) located atop substrate, said ILD including at least one conductive feature embedded therein; and
   a dense dielectric comprising either (i) boron and at least one of carbon, nitrogen and hydrogen or (ii) phosphorus and nitrogen, wherein said dense dielectric and said ILD are in intimate contact and top surfaces of said ILD and said at least one conductive feature are essentially coplanar, and wherein said dense dielectric is amorphous and non-porous.

2. The electronic structure of claim 1 wherein said dense dielectric comprises boron and further at least one of Si, F, P and Ge.

3. The electronic structure of claim 2 wherein said dense dielectric comprises $B_xC_yR_z$ or $B_xN_yR_z$ wherein x, y and z are integers that represent a range of each component and R is a substituent selected from the group consisting of halogens, hydrogen, alkyl, aryl, alkoxy, amino and substituted amino.

4. The electronic structure of claim 1 wherein said dense dielectric has a density from about 0.9 to about 2.0 grams/$cm^3$.

5. The electronic structure of claim 1 wherein said dense dielectric is a dielectric diffusion barrier layer to cap a conductive material located in a conductive feature below said dense dielectric.

6. The electronic structure of claim 5 wherein said dense dielectric is a single layer.

7. The electronic structure of claim 5 wherein said dense dielectric is a top layer of a bilayer structure.

8. The electronic structure of claim 1 wherein said dense dielectric is a buried etch stop layer located at the bottom of a conductive line located within said ILD.

9. The electronic structure of claim 1 wherein said dense dielectric is a chemical mechanical polish stop layer, wherein an upper surface of said dense dielectric is essentially coplanar with an upper surface of said conductive material.

10. The electric structure of claim 1 wherein said dense dielectric comprises phosphorus and optionally at least one of hydrogen, nitrogen, silicon, germanium and fluorine.

11. A boron-based dielectric material comprising boron and at least one of C, N, and H, wherein said boron is present in an amount from about 5 to about 90 atomic percent, and said dielectric material is amorphous, non-porous and has a density from about 0.9 to about 2.0 $gm/cm^3$.

12. The boron-based dielectric material of claim 11 wherein C is present in an amount from about 5 to about 50 atomic percent.

13. The boron-based dielectric material of claim 11 wherein N is present in an amount from about 5 to about 50 atomic percent.

14. The boron-based dielectric material of claim 11 wherein H is present in an amount from about 20 to about 60 atomic percent.

15. The boron-based dielectric material of claim 11 further comprising at least one of Si, F, P and Ge.

16. A phosphorus-nitrogen-based dielectric material comprising P and N and optionally at least one of hydrogen, silicon, germanium and fluorine, said dielectric material is amorphous, non-porous, has a density from about 0.9 to about 2.0gm/cm$^3$, a phosphorus content from about 3 to about 50 atomic percent and a nitrogen content from about 3 to about 50 atomic percent.

* * * * *